US009232682B2

(12) United States Patent
Liu

(10) Patent No.: US 9,232,682 B2
(45) Date of Patent: Jan. 5, 2016

(54) BASE STATION IN A WIRELESS COMMUNICATION SYSTEM

(75) Inventor: Mingyan Liu, Beijing (CN)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/383,270

(22) PCT Filed: Mar. 5, 2012

(86) PCT No.: PCT/CN2012/071907
§ 371 (c)(1),
(2), (4) Date: Sep. 5, 2014

(87) PCT Pub. No.: WO2013/131226
PCT Pub. Date: Sep. 12, 2013

(65) Prior Publication Data
US 2015/0031415 A1 Jan. 29, 2015

(51) Int. Cl.
| | |
|---|---|
| *H01L 23/38* | (2006.01) |
| *H05K 7/20* | (2006.01) |
| *H01L 23/433* | (2006.01) |
| *H04W 88/08* | (2009.01) |
| *H05K 9/00* | (2006.01) |

(52) U.S. Cl.
CPC ............ *H05K 7/20509* (2013.01); *H01L 23/38* (2013.01); *H01L 23/433* (2013.01); *H04W 88/08* (2013.01); *H05K 7/20418* (2013.01); *H05K 7/20436* (2013.01); *H05K 7/20545* (2013.01); *H05K 9/0052* (2013.01); *H01L 2924/0002* (2013.01)

(58) Field of Classification Search
CPC ............................ H05K 7/20509; H01L 23/38
USPC ............... 455/561, 403, 418, 419, 424, 507, 455/562.1; 361/702, 704, 709, 699; 62/3.5, 62/259.3, 3.2
See application file for complete search history.

(56) References Cited

U.S. PATENT DOCUMENTS

| | | | |
|---|---|---|---|
| 6,294,721 B1 | 9/2001 | Oravetz et al. | |
| 7,436,059 B1 | 10/2008 | Ouyang | |
| 9,054,832 B2* | 6/2015 | Barnard | H04B 10/572 |
| 2002/0005216 A1* | 1/2002 | Oravetz | H01L 35/02 |
| | | | 136/200 |
| 2002/0162338 A1 | 11/2002 | Shimada et al. | |
| 2005/0041397 A1* | 2/2005 | Alford | H01L 23/38 |
| | | | 361/720 |

(Continued)

FOREIGN PATENT DOCUMENTS

| | | |
|---|---|---|
| CN | 101876833 A | 11/2010 |
| CN | 201898629 U | 7/2011 |

OTHER PUBLICATIONS

PCT International Search Report for Counterpart PCT Application No. PCT/CN2012/071907, (Dec. 13, 2012), 3 pages.

(Continued)

*Primary Examiner* — John J Lee
(74) *Attorney, Agent, or Firm* — NDWE LLP

(57) ABSTRACT

This disclosure provides a base station in a wireless communication system. The base station comprises a field programmable gate array (FPGA) with an upper side and a bottom side, a thermoelectric cooler (TEC) with a hot side and a cold side, a thermal pad, and an anti-radiation cover. The cold side of TEC is thermally coupled with the upper side of the FPGA, the thermal pad is thermally coupled with the hot side of TEC, and the anti-radiation cover is thermally coupled with the thermal pad.

6 Claims, 4 Drawing Sheets

(56) References Cited

U.S. PATENT DOCUMENTS

2005/0083657 A1* 4/2005 Hamman ................ F28D 15/00
  361/699
2007/0199333 A1* 8/2007 Windisch ........... A41D 13/0051
  62/3.5

OTHER PUBLICATIONS

Chein, et al., "Thermoelectric cooler application in electronic cooling", *Applied Thermal Engineering*, vol. 24, (2004), pp. 2207-2217.

Simons, et al., "Application of thermoelectric cooling to electronic equipment: a review and analysis", *Semiconductor Thermal Measurement and Management Symposium, 2000, Sixteenth Annual IEEE*, (2000), pp. 1-9.

PCT International Preliminary Report on Patentability (Chapter 1) for Counterpart PCT Application No. PCT/CN2012/071907, (Sep. 18, 2014), 5 pages.

Extended European Search Report, EP Application No. 12870711.4, dated Oct. 6, 2015, 5 pages.

\* cited by examiner

BASE STATION IN A WIRELESS COMMUNICATION SYSTEM

CROSS-REFERENCE TO RELATED APPLICATIONS

This application is a National stage of International Application No. PCT/CN2012/071907, filed Mar. 5, 2012, which is hereby incorporated by reference.

TECHNICAL FIELD

The present invention generally relates to a base station in a wireless communication system. More specifically, and in various embodiments, the present invention relates to cooling of components in the base station.

BACKGROUND

There are scenarios when a base station works under a high ambient temperature, some components may shut off due to a high temperature exceeding the limitation. For example, as part of a base station, RRU (Remote Radio Unit) includes one or more FPGAs (Field Programmable Gate Array). The RRU's power consumption is about 500 w or even higher. When the base station works in an ambient temperature of 45° C. with natural cooling, the temperature of FPGAs is close to its limitation 100° C. So the base station can not work under 55° C. due to failure of FPGAs. Thus, there is a need to cool down the FPGAs to ensure that the whole base station works under a high ambient temperature.

SUMMARY OF THE INVENTION

Embodiments of the present invention obviate the above problem or disadvantage and provide an improved solution for a base station. One aspect of the invention provides a base station in a wireless communication system. The base station comprises a FPGA with an upper side and a bottom side, a TEC (thermoelectric cooler) with a hot side and a cold side, a thermal pad, and an anti-radiation cover. The cold side of TEC is thermally coupled with the upper side of the FPGA, the thermal pad is thermally coupled with the hot side of TEC, and the anti-radiation cover is thermally coupled with the thermal pad.

In one aspect, the TEC is circumambient by the thermal pad.

In another aspect, the thickness of the thermoelectric cooler is smaller than that of the thermal pad.

In another aspect, the base station further comprises a control module configured to control the working status of the TEC.

In another aspect, the control module is configured to control the TEC to turn on when the FPGA's temperature is equal or larger than a first predetermined threshold, and to control the thermoelectric cooler to turn off when the FPGA's temperature is lower than a second predetermined threshold. The first predetermined threshold is larger than the second predetermined threshold.

BRIEF DESCRIPTION OF THE DRAWINGS

The foregoing and other objects, features, and advantages of the invention will be apparent from the following more particular description of embodiments and illustration of the accompanying drawings.

DETAILED DESCRIPTION

Figure 1:
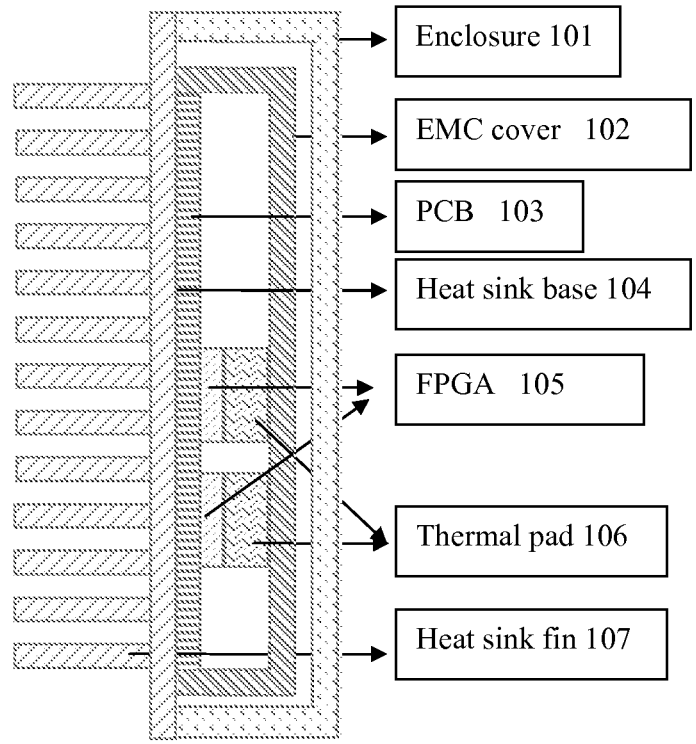
FIG. 1 shows schematic structure for parts of a base station.

While the invention covers various modifications and alternative constructions, embodiments of the invention are shown in the drawings and will hereinafter be described in detail. However it should be understood that the specific description and drawings are not intended to limit the invention to the specific forms disclosed. On the contrary, it is intended that the scope of the claimed invention includes all modifications and alternative constructions thereof falling within the scope of the invention as expressed in the appended claims.

Unless defined in the context of the present description, otherwise, all technical and scientific terms used herein have the same meaning as commonly understood by one of ordinary skill in the art to which this invention belongs.

The arrangement and process, as shown in the following drawings, can be implemented in form of software, hardware, firmware or the combination thereof.

Figure 2:
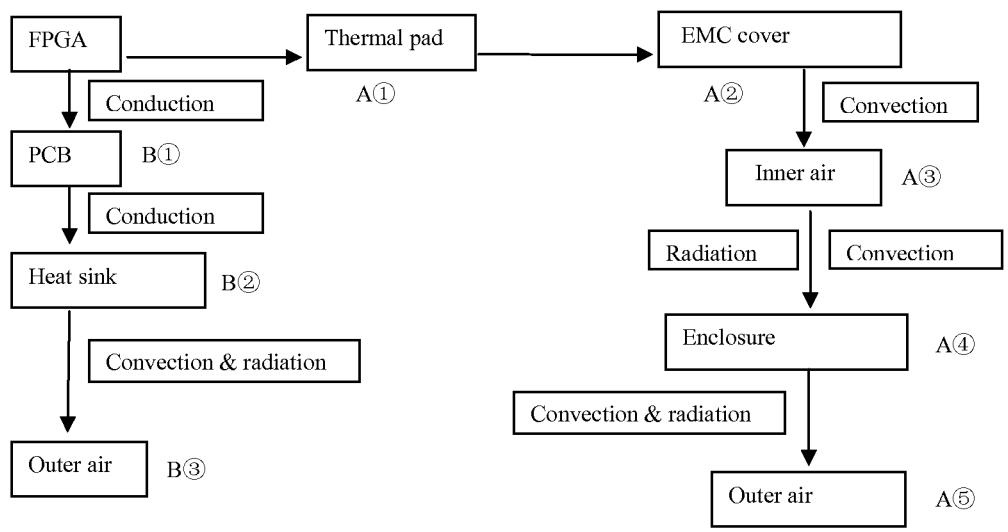
FIG. 2 is a flowchart illustrating heat transfer path associated with FPGA.

Referring to FIG. 1, a typical base station includes at least one FPGA 105, an enclosure 101, an EMC (Electro Magnetic Compatibility) cover 102, a thermal pad 106, a PCB (Printed Circuit Board) 103, a heat sink including a heat sink base 104, and a fin 107. There are two heat transfer paths for the FPGA 105. One path is through the thermal pad 106, the EMC cover 102, the enclosure 101, and then to outer air, herein referred to as path A. The other path is through the PCB 103, the heat sink, then to outer air, herein referred to as path B. More details can be found in FIG. 2.

In order to reduce the temperature of the FPGA, some cooling methods could be used, such as increasing the fin height of the heat sink, improving heat transfer capability of the thermal pad by changing its material or size. All these methods are focused on decreasing the thermal resistance through path A or path B, and either have low efficiency or at the expense of big increase in volume. For example, according to a test, the temperature decreases by 4~5° C. through increasing fin height, but the volume is increased by about 7%. If we want to decrease the temperature of the FPGA by 10° C., the volume should be increased more than 14%. By using methods of changing the thermal pad, although there is no significant increase in volume, the temperature decreases only by 1-2° C.

Thermoelectric cooler (TEC) has been used in satellites, spacecraft, digital cameras and CPU to cool electric devices. Some articles focus on how to increase the cooling efficiency by improving the cooling capacity in the hot side of TEC, such as combined micro-channel and cold plate in the hot side of TEC. Examples of these articles are "Thermoelectric Cooler Application in Electronic Cooling" written by Reiyu Chein and Guanming Huang, published in Applied Thermal Engineering, Vol. 24: 2207~2217, 2004, and "Application of Thermoelectric Cooling to Electronic Equipment: a Review and Analysis" written by R. E. Simons and R. C. Chu, published in Sixteenth IEEE SEMI-THERMTMS ymposium. 1~9, 2000.

Two patent documents U.S. Pat. No. 6,294,721 B1 and US 2002/0005216 A1) disclose the use of TEC to cool internal air temperature in battery system of telecommunication field. In a US patent application with publication number 2005/0041397 A1, TEC is used to cool down the amplifier transistor which usually has high heat dissipation in the magnitude of hundred Walt, but the patent application does not involves cooling of FPGA which usually has lower heat dissipation about 10 Walt. Because of the different characters and positions between FPGA and amplifier transistor or between FPGA and battery system, if TEC is used to cool down the FPGA, a new structure design is needed.

Figure 3:
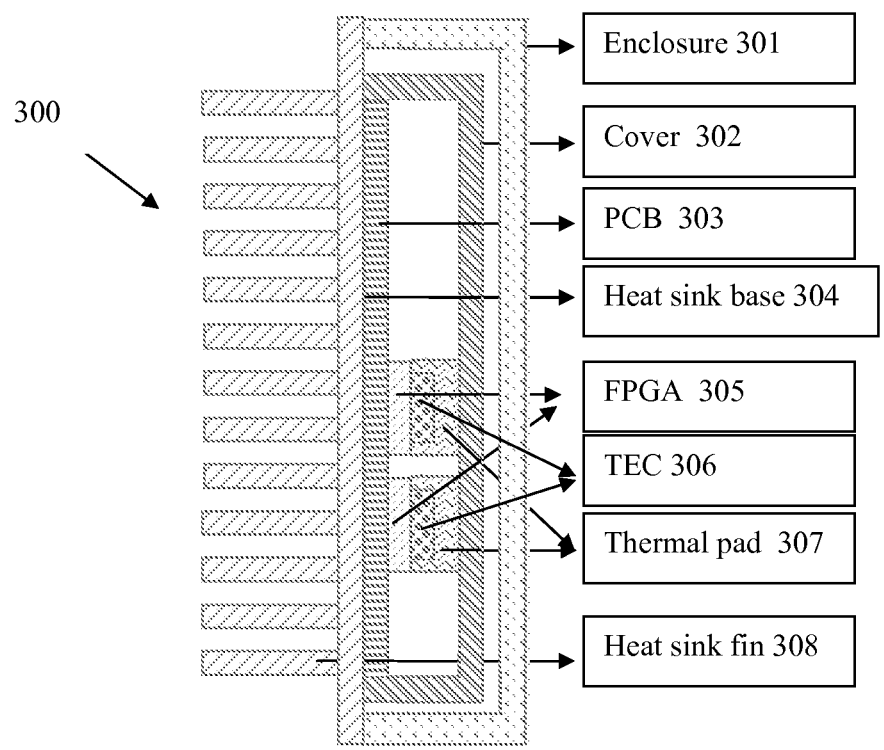
FIG. 3 shows schematic structure for parts of a base station according to one embodiment.

Referring to FIG. 3, a new structure is disclosed which can be used in various embodiments of this invention. As shown in FIG. 3, as part of a base station, a RRU 300 includes a FPGA 305 with an upper side and a bottom side, a TEC 306 with a hot side and a cold side, a thermal pad 307, and an anti-radiation cover 302. The cold side of the TEC 306 is thermally coupled with the upper side of the FPGA, and the hot side of the TEC 306 is thermally coupled with the thermal pad 307. The thermal pad 307 is thermally coupled with the anti-radiation cover 302. One example of anti-radiation cover is an EMC cover. It shall be understood that other components can be included as part of the RRU and base station, which have been omitted from FIG. 3 in order to avoid obscuring the invention. It should be noted that there may be more than one FPGA in a base station, and thus, more than one TEC may be used.

The heat generated by the FPGA is transferred from the cold side of TEC to the hot side of TEC, and then through the thermal pad to the anti-radiation cover. By using the TEC, the FPGA's temperature is highly reduced, and thus, improves the ambient temperature where the whole base station works. The thermal resistance of FPGA to anti-radiation cover is smaller than that to heat sink, and thus, it is preferred that the TEC is used in the anti-radiation cover side, that is, being used between the FPGA and the thermal pad which is thermally coupled with the anti-radiation cover, to improve the efficiency of heat transfer.

RRU 300 may include an enclosure 301. RRU 300 may further include a PCB 303 which is thermally coupled with a heat sink, more specifically with a heat sink base 304 of the heat sink. The heat sink includes a heat sink fin 308 which has many fins to transfer the heat. Thus, in addition to the heat transfer path from the TEC to the anti-radiation cover, the heat generated by the FPGA may be transferred through another path, for example, from the PCB to the heat sink. This structure further improves the heat transfer efficiency.

Figure 4A:
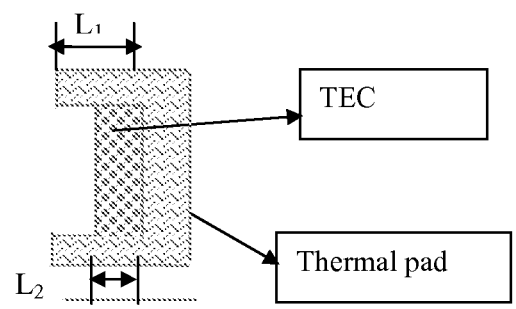
FIG. 4a shows a design of TEC and thermal pad before being assembled.
Figure 4B:
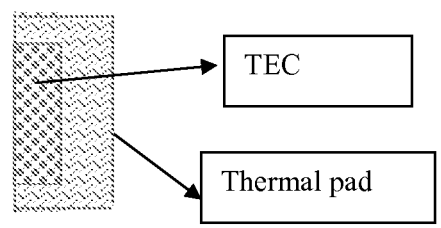
FIG. 4b shows a design of TEC and thermal pad after being assembled.

In an embodiment, as shown in FIG. 3, the TEC is circumambient by the thermal pad. This design will keep the heat transfer path from the FPGA to the thermal pad, and then to anti-radiation cover still working in case that the TEC does not work, and thus, reliability is improved. In addition, this design will ensure no substantial increase in volume of the whole base station. As shown in FIG. 4, it is preferred that the thickness of the thermal pad (L1) is larger than the thickness of the TEC (L2). This design keeps the FPGA and the thermal pad in tight contact after being assembled.

Figure 5:
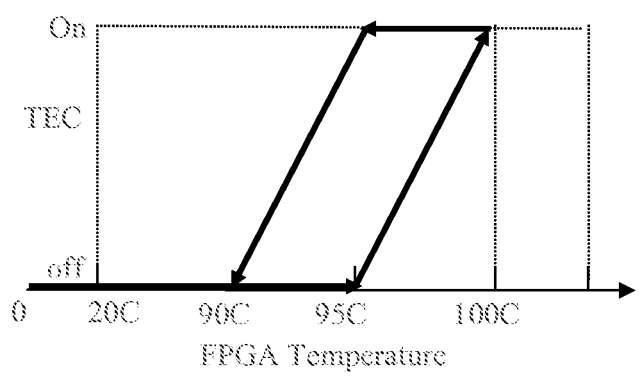
FIG. 5 shows the control strategy for the control module according to one embodiment.

In an embodiment, a control module (not shown in FIG. 3) may be used to control the working status of the TEC, and thus, controlling the FPGA's temperature more accurately not to exceed a limited value. The working status of the TEC includes power-on/turn on and power-off/turn off. In an example, two predetermined thresholds could be set. As shown in FIG. 5, usually the limited value of FPGA's temperature is 100° C., so we can set a first predetermined threshold as 95° C., and set the second predetermined threshold as 90° C. After the RRU starts to operate, the temperature of the FPGA will increase. If the PFGA's temperature increases to a value equal to or larger than the first predetermined threshold, the control module will control the TEC to turn on. If the FPGA's temperature is lower than the second predetermined threshold, the control module will control the TEC to turn off. The control module may be integrated in the PCB, or combined with the TEC, or in any other suitable places in the base station.

Figure 6:
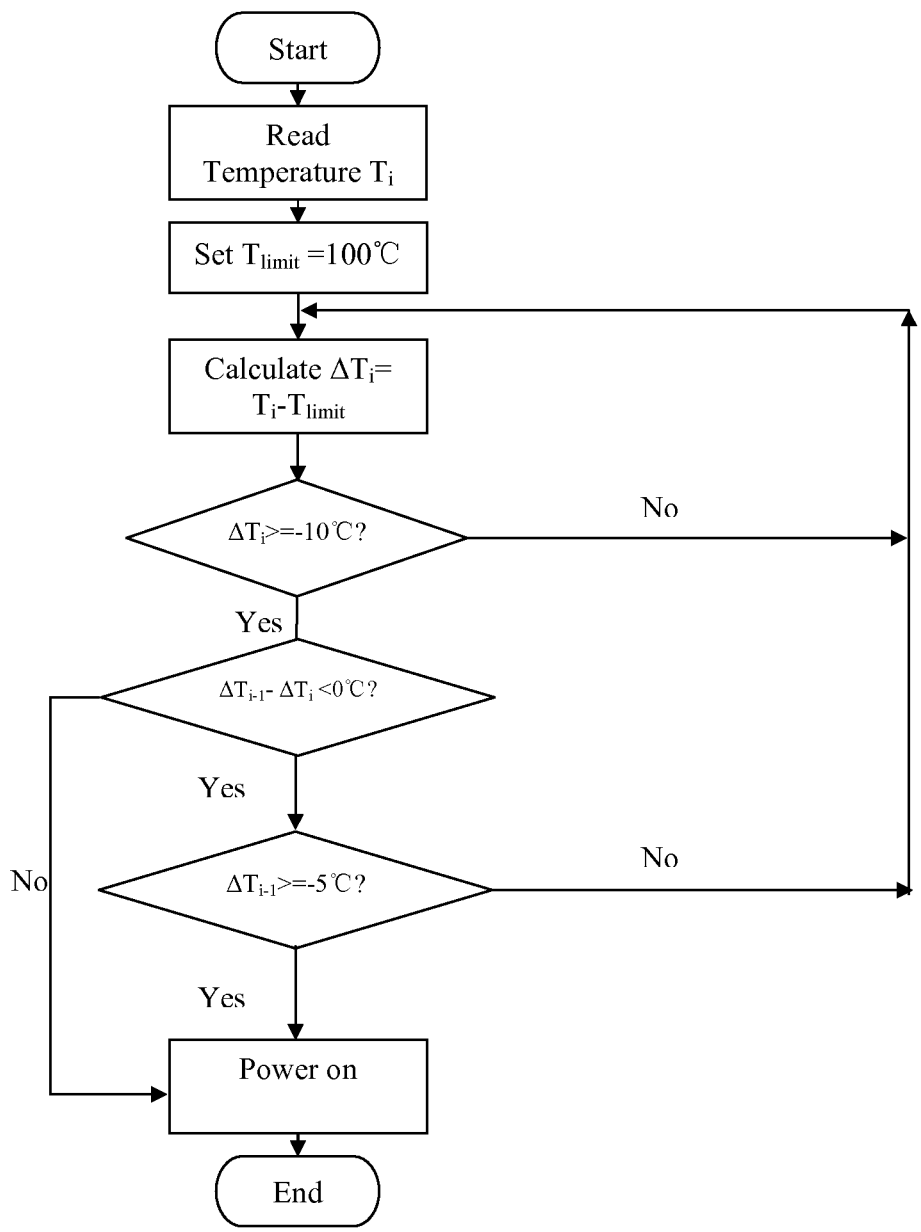
FIG. 6 is a flowchart illustrating the control algorithm for the control module according to one embodiment.

One example of control process for the control module is showed in FIG. 6, where the limited value $T_{limit}$ for TEC is 100° C., Ti is the current temperature of TEC, $\Delta T_i$ means the difference between $T_i$ and $T_{limit}$. $T_{i-1}$ means the temperature of TEC in last time. $\Delta T_{i-1}$ means the difference between $T_{i-1}$ and $T_{limit}$.

By introduction of the control module, TEC is only used to cool FPGA from high temperature to the second predetermined threshold, not for refrigeration, which means the heat only transferred from high temperature to low temperature, and the temperature of FPGA is always higher than the anti-radiation cover's temperature. Thus the cooling efficiency is strongly increased. In addition, TEC only turns on when the FPGA's temperature increases to the first predetermined threshold and then turns off until temperature decrease to the second predetermined threshold, and does not need to work in most of the time. Thus the energy is saved.

It should be noted that the aforesaid embodiments are illustrative of this invention instead of restricting this invention, substitute embodiments may be designed by those skilled in the art without departing from the scope of the claims enclosed. Although some embodiments are described under base station with MU (Main Unit)-RRU or BBU (Base Band Unit)-RRU structure, this invention is applied to other types of base stations in various networks, such as Radio Base Station in WCDMA, eNodeB in LTE. This invention is also applied to devices having functions similar to base station, such as relay nodes in network. The wordings such as "include", "including", "comprise" and "comprising" do not exclude elements or steps which are present but not listed in the description and the claims. It also shall be noted that as used herein and in the appended claims, the singular forms "a", "an", and "the" may include plural referents unless the context clearly dictates otherwise. For example, the base station includes a FPGA, a thermal pad, or a TEC, means the base station includes one or more FPGA, thermal pad or TEC. This invention can be achieved by means of hardware including several different elements or by means of a suitably programmed computer. In the unit claims that list several means, several ones among these means can be specifically embodied in the same hardware item. The use of such words as first, second third does not represent any order, which can be simply explained as names.

I claim:

1. A base station in a wireless communication system, comprising:
   a field programmable gate array (FPGA) with an upper side and a bottom side;
   a thermoelectric cooler with a hot side and a cold side, the cold side being thermally coupled with the upper side of the FPGA;
   a thermal pad thermally coupled with the hot side of the thermoelectric cooler; and
   an anti-radiation cover thermally coupled with the thermal pad.

2. The base station according to claim 1, wherein the thermoelectric cooler is circumambient by the thermal pad.

3. The base station according to claim 2, wherein a thickness of the thermoelectric cooler is smaller than that of the thermal pad.

4. The base station according to claim 1, further comprising a control module configured to control a working status of the thermoelectric cooler.

5. The base station according to claim 4, wherein the control module is configured to control the thermoelectric cooler to turn on when the FPGA's temperature is equal or larger than a first predetermined threshold, and to turn off when the FPGA's temperature is lower than a second predetermined threshold, the first predetermined threshold being larger than the second predetermined threshold.

6. The base station according to claim 1, wherein the bottom side of the FPGA is thermally coupled with a printed circuit board (PCB), and the PCB is thermally coupled with a heat sink.

* * * * *